(12) United States Patent
Karda et al.

(10) Patent No.: US 9,059,030 B2
(45) Date of Patent: Jun. 16, 2015

(54) MEMORY CELLS HAVING CAPACITOR DIELECTRIC DIRECTLY AGAINST A TRANSISTOR SOURCE/DRAIN REGION

(75) Inventors: Kamal M. Karda, Boise, ID (US); Suraj J. Mathew, Boise, ID (US); Jaydip Guha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 162 days.

(21) Appl. No.: 13/269,304

(22) Filed: Oct. 7, 2011

(65) Prior Publication Data
US 2013/0087840 A1   Apr. 11, 2013

(51) Int. Cl.
*H01L 27/108* (2006.01)
*H01L 29/94* (2006.01)

(52) U.S. Cl.
CPC .... *H01L 27/10832* (2013.01); *H01L 27/10861* (2013.01); *H01L 29/945* (2013.01)

(58) Field of Classification Search
CPC ................... H01L 27/10891; H01L 27/10867; H01L 27/10876; H01L 27/10829; H01L 27/10864; H01L 27/10861; H01L 29/645; H01L 27/10841; H01L 29/945; H01L 21/26513; H01L 27/10832; H01L 2924/0002; H01L 29/0878; H01L 28/40
USPC .............................. 257/301, E27.09; 438/243
See application file for complete search history.

(56) References Cited

U.S. PATENT DOCUMENTS

| 4,649,625 | A | * | 3/1987 | Lu | 438/245 |
| 4,791,610 | A | * | 12/1988 | Takemae | 365/149 |
| 4,803,535 | A | * | 2/1989 | Taguchi | 257/301 |
| 5,200,354 | A | | 4/1993 | Om et al. | |
| 5,204,281 | A | * | 4/1993 | Pfiester | 438/245 |
| 6,218,693 | B1 | * | 4/2001 | Lu | 257/296 |
| 6,495,377 | B2 | * | 12/2002 | Hsu | 438/3 |
| 6,576,945 | B2 | | 6/2003 | Mandelman et al. | |
| 6,750,509 | B2 | | 6/2004 | Benzinger et al. | |
| 6,946,700 | B2 | | 9/2005 | Noble | |
| 7,470,585 | B2 | * | 12/2008 | Menut et al. | 438/245 |
| 7,911,028 | B2 | * | 3/2011 | Lin et al. | 257/532 |
| 2004/0232461 | A1 | * | 11/2004 | Huang | 257/296 |
| 2006/0024878 | A1 | * | 2/2006 | Forbes et al. | 438/211 |
| 2007/0085125 | A1 | * | 4/2007 | Inoue et al. | 257/301 |
| 2008/0012068 | A1 | | 1/2008 | Lee et al. | |
| 2010/0032742 | A1 | * | 2/2010 | Barth et al. | 257/301 |

* cited by examiner

*Primary Examiner* — Duy T Nguyen
(74) *Attorney, Agent, or Firm* — Wells St. John, P.S.

(57) ABSTRACT

A memory cell includes a transistor device comprising a pair of source/drains, a body comprising a channel, and a gate construction operatively proximate the channel. The memory cell includes a capacitor comprising a pair of capacitor electrodes having a capacitor dielectric there-between. One of the capacitor electrodes is the channel or is electrically coupled to the channel. The other of the capacitor electrodes includes a portion of the body other than the channel. Methods are also disclosed.

26 Claims, 2 Drawing Sheets

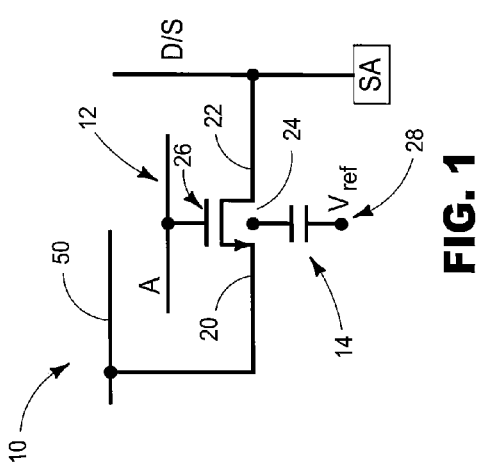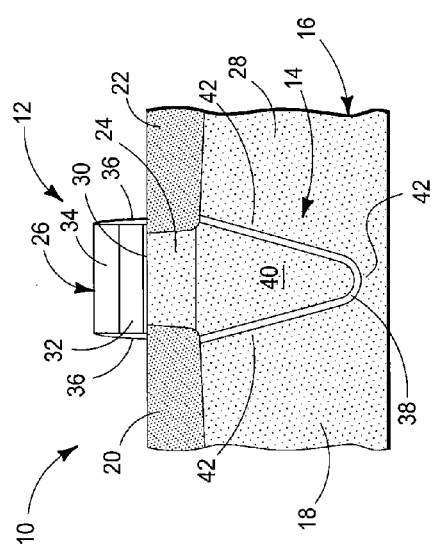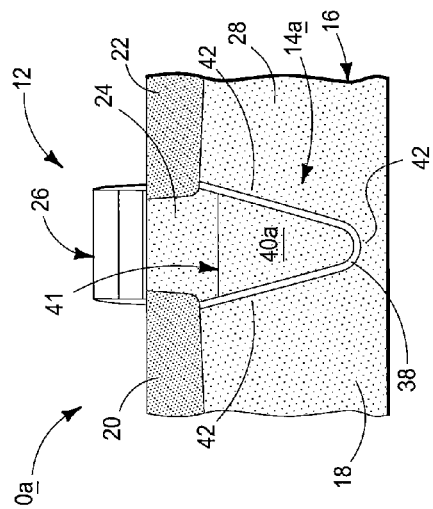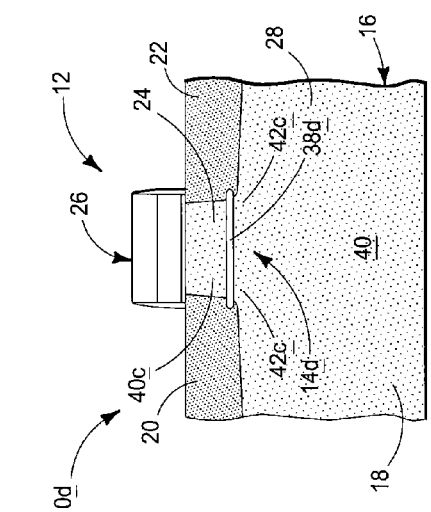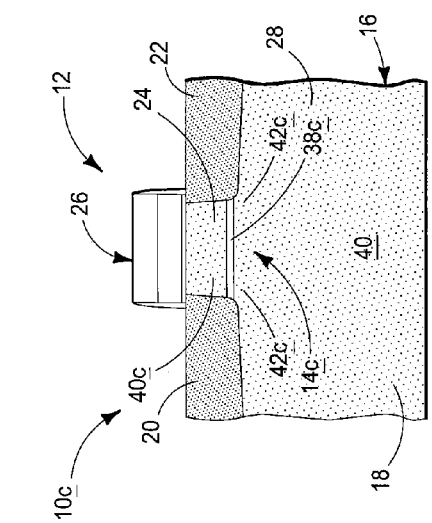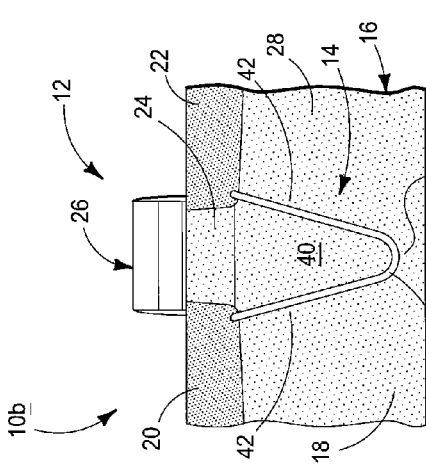

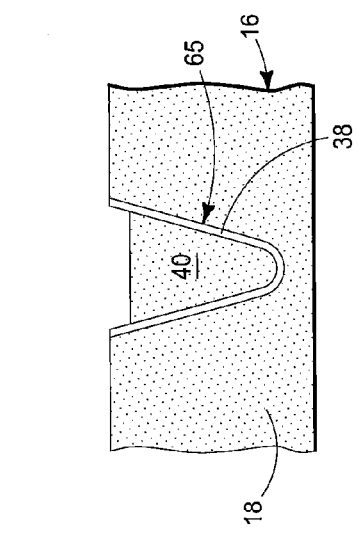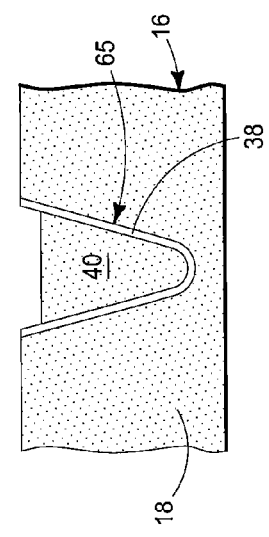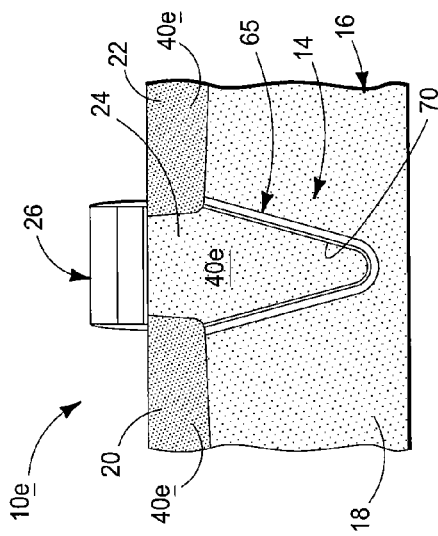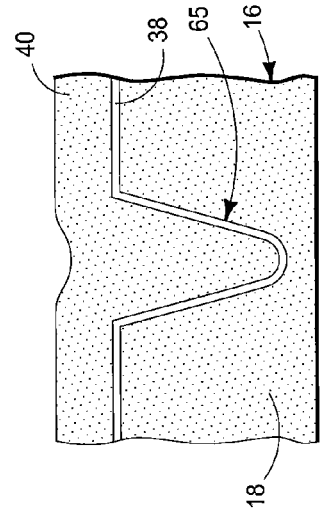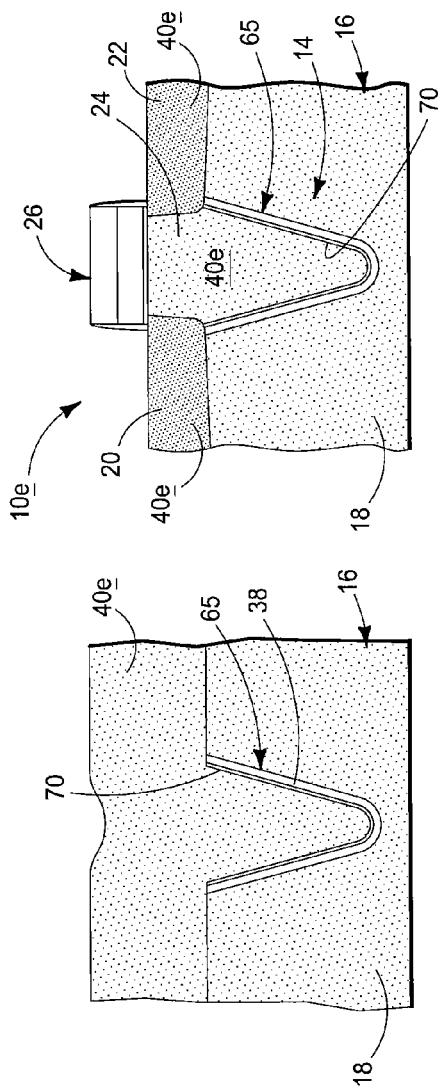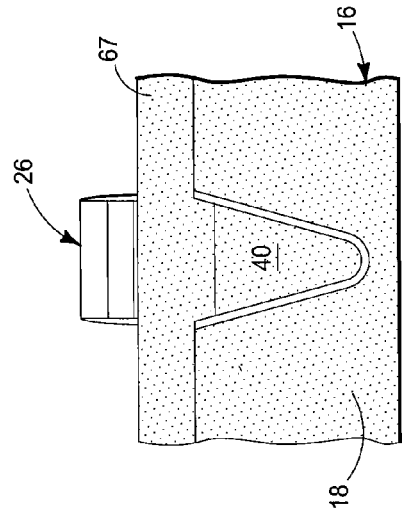

MEMORY CELLS HAVING CAPACITOR DIELECTRIC DIRECTLY AGAINST A TRANSISTOR SOURCE/DRAIN REGION

TECHNICAL FIELD

Embodiments disclosed herein pertain to memory cells and to methods of forming memory cells.

BACKGROUND

Integrated circuits may be formed on a semiconductor substrate such as a silicon wafer or other semiconducting material. In general, layers of various materials which are either semiconducting, conducting, or insulating are used to form the integrated circuits. By way of example, the various materials are doped, ion implanted, deposited, etched, grown, etc. using various processes. A continuing goal in semiconductor processing is to continue to reduce the size of individual electronic components thereby enabling smaller and denser integrated circuitry.

Memory is one type of integrated circuitry, and is used in computers systems for storing data. Memory may be fabricated in one or more arrays of individual memory cells. Memory cells may be written to or read from using digit lines (which may also be referred to as bit lines, data lines, sense lines, or data/sense lines) and access lines (which may also be referred to as word lines). The digit lines may electrically interconnect memory cells along columns of the array, and the access lines may electrically interconnect memory cells along rows of the array. Each memory cell may be uniquely addressed through the combination of a digit line and an access line.

Memory cells may be volatile, semi-volatile, or non-volatile. Non-volatile memory cells can store data for extended periods of time, in many instances including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

Example volatile memory cells are Dynamic Random Access Memory (DRAM) cells. One type of DRAM cell includes a field effect transistor and a storage capacitor. As the size of integrated circuitry shrinks, the size of the capacitor also shrinks. Generally as the size of the storage capacitor shrinks, the quantity of charge and the time which the charge can be retained decreases as well. Consequently, maintaining an acceptable level of performance of this type of DRAM structure becomes more difficult as the capacitor size decreases. Additionally, the act of reading a DRAM cell having a capacitor is destructive. This requires not only determination of the read state, but then immediately rewriting that state back to the individual DRAM cell after the act of reading.

Another type of DRAM cell uses a structure which does not have a storage capacitor. An example of capacitor-less DRAM consists essentially of only a single transistor (1T) memory cell. Such DRAM cells may use a semiconductor-on-insulator (SOI) structure for storing positive electrical charge in the form of "holes". The stored positive charge reduces the transistor threshold voltage ($V_t$), which is the voltage applied to the gate at which the channel region between the pair of source/drain regions becomes conductive. Binary data states are represented in a 1T memory cell based upon whether the transistor is switched "on" or remains "off" in response to a voltage applied to its gate during a memory read operation. Further, the act of reading the memory cell state of capacitor-less DRAM cells may be non-destructive.

BRIEF DESCRIPTION OF THE DRAWINGS

FIG. 1 is a schematic of a memory cell in accordance with an embodiment of the invention.

FIG. 2 is a diagrammatic sectional view of a substrate fragment comprising a memory cell in accordance with an embodiment of the invention.

FIG. 3 is a diagrammatic sectional view of a substrate fragment comprising a memory cell in accordance with an embodiment of the invention.

FIG. 4 is a diagrammatic sectional view of a substrate fragment comprising a memory cell in accordance with an embodiment of the invention.

FIG. 5 is a diagrammatic sectional view of a substrate fragment comprising a memory cell in accordance with an embodiment of the invention.

FIG. 6 is a diagrammatic sectional view of a substrate fragment comprising a memory cell in accordance with an embodiment of the invention.

FIG. 7 is a diagrammatic sectional view of a substrate fragment in process in accordance with an embodiment of the invention.

FIG. 8 is a view of the FIG. 7 substrate at a processing step subsequent to that shown by FIG. 7.

FIG. 9 is a diagrammatic sectional view of a substrate fragment in process in accordance with an embodiment of the invention.

FIG. 10 is a view of the FIG. 9 substrate at a processing step subsequent to that shown by FIG. 9.

FIG. 11 is a diagrammatic sectional view of a substrate fragment in process in accordance with an embodiment of the invention.

FIG. 12 is a view of the FIG. 11 substrate at a processing step subsequent to that shown by FIG. 11, and shows a memory cell in accordance with an embodiment of the invention.

DETAILED DESCRIPTION OF EXAMPLE EMBODIMENTS

Example embodiments of a memory cell in accordance with the invention are initially described with reference to FIGS. 1 and 2. A memory cell 10 comprises a transistor device 12 and a capacitor 14. Such have been fabricated relative to a semiconductor substrate 16. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. As examples, semiconductor substrate 16 may comprise bulk monocrystalline material (e.g., silicon) and/or a semiconductor-on-insulator substrate.

Substrate 16 comprises semiconductor material 18 portions of which have been suitably background doped with one or more conductivity modifying impurities to function as a transistor channel and as a capacitor electrode of the memory cell. Portions of semiconductor material 18 might be differently doped with the same or different type conductivity modifying impurities to provide one or more different current conductive operating characteristics based upon applied voltage. Regardless, semiconductor material 18 comprises a body of transistor device 12, and comprises a pair of source/drains 20, 22 and a channel 24. Semiconductor material 18 includes a body region 28 other than source/drains 20, 22 and channel 24. Suitable dopant type and concentrations may be selected by the artisan. As an example, source/drains 20, 22 may be doped n-type, with channel 24 and body region 28 doped p-type. Halo and/or LDD regions (not shown) may additionally be provided. Example p-type dopant concentration for channel 24 is about $1 \times 10^{18}$ ions/cm$^3$ and that for body region 28 is about $2 \times 10^{18}$ ions/cm$^3$. Example n-type dopant concentration for the source/drain regions 20, 22 is at least about $5 \times 10^{19}$ ions/cm$^3$.

A gate construction 26 is operatively proximate channel 24, and may comprise portion of an access line A (FIG. 1). Gate construction 26 comprises a gate dielectric 30, a conductive portion 32, a dielectric cap 34, and dielectric sidewall spacers 36. The dielectrics may be homogenous or non-homogenous, of the same of different composition(s), and with silicon dioxide, silicon nitride, and other high k dielectrics being examples. Conductive region 32 may be homogenous or non-homogenous, for example comprising one or more of conductively doped semiconductive material (e.g., conductively doped polysilicon), elemental metals, and/or metal compounds (e.g., conductive metal silicides). Gate construction 26 may comprise charge storage regions (not shown), for example a floating gate region (not shown) and associated inter-dielectric (not shown).

FIG. 2 shows an example horizontal structure, for example where channel 24 is horizontally oriented and where gate construction 26 is above channel 24. However, vertical or other orientations may be used. In this document, vertical is a direction generally orthogonal to a primary surface relative to which the substrate is processed during fabrication and which may be considered to define a generally horizontal direction. Further, "vertical" and "horizontal" as used herein are generally perpendicular directions relative one another independent of orientation of the substrate in three dimensional space. Further, words such as "underlying", "under", "outward", "beneath", "above", and "elevationally" are relative terms corresponding to the vertical direction with respect to the structure being described.

Capacitor 14 comprises a pair of capacitor electrodes having a capacitor dielectric 38 there-between. Source/drains 20, 22 may extend over capacitor dielectric 38. Capacitor dielectric 38 may be homogenous or non-homogenous, and comprise any suitable material(s). Silicon dioxide, silicon nitride, and high k dielectric constant materials are examples. An example thickness range for capacitor dielectric 38 is from about 20 Angstroms to about 70 Angstroms. In one embodiment and as shown, capacitor dielectric is V-shaped in lateral cross-section.

Capacitor 14 has one of its capacitor electrodes as the channel of the transistor device or has one of its capacitor electrodes electrically coupled to the channel of the transistor device (i.e., the channel comprises structure in addition to or separate from but electrically coupled to that portion of semiconductive material which is capable of functioning as the channel of the transistor device). FIG. 2 shows an example where capacitor 14 includes one capacitor electrode 40 that is electrically coupled to channel 24 as opposed to inherently being the channel itself. Regardless, capacitor 14 has its other electrode 42 as comprising a portion of body region 28 (e.g., at least that portion of body region 28 that is received immediately adjacent capacitor dielectric 38) which is other than the channel of the transistor device. In one embodiment, other capacitor electrode 42 comprises conductivity modifying dopant of the same type (i.e., either p or n) and of the same concentration as that of channel 24.

Channel 24 and capacitor electrode 40 may be of the same composition or may be of different compositions relative one another. Regardless, in one embodiment each of channel 24 and capacitor electrode 40 comprises doped silicon. In one embodiment channel 24 may be substantially monocrystalline and capacitor electrode 40 may be substantially polycrystalline. In this document, a material is substantially monocrystalline if at least 95% by volume of the material is monocrystalline, and a material is polycrystalline if at least 95% by volume of the material is polycrystalline. In one embodiment, capacitor electrode 40 comprises conductivity modifying dopant of the same type and of the same concentration as that of channel 24. In one embodiment, capacitor electrode 40 comprises conductivity modifying dopant of the same type as that of channel 24 and of different concentration from that of channel 24, for example in one embodiment being of higher concentration from that of channel 24.

The dopant concentrations within each of regions 20, 22, 24, 28, 40, and 42 may or may not be homogenous. Further, regions 20, 22, 24, 28, 40, and 42 may be homogenous or non-homogenous independent of consideration of homogeneity with respect to the dopants.

In some embodiments, one or both of the source/drains are directly against the capacitor dielectric and/or directly against the one capacitor electrode. In this document, a material or structure is "directly against" another when there is at least some physical touching contact of the stated materials or structures relative one another. In contrast, "over" encompasses "directly against" as well as constructions where intervening material(s) or structure(s) result(s) in no physical touching contact of the stated materials or structures relative one another. FIG. 2 shows an example embodiment wherein both of source/drains 20, 22 are directly against each of capacitor dielectric 38 and capacitor electrode 40.

In one embodiment, memory cell 10 comprises a data/sense line D/S (FIG. 1) that is electrically coupled to one of the source/drains 20, 22. Data/sense line D/S may connect with a sense amp SA. In one embodiment, memory cell 10 comprises a reference voltage line 50 (other than a data/sense line D/S) that is electrically coupled to one of source/drains 20, 22. FIG. 1 shows an example embodiment wherein a data/sense line D/S is electrically coupled to source/drain 22 and a reference voltage line 50 other than a data/sense line is electrically coupled to source/drain 20.

FIG. 3 shows an alternate embodiment memory cell 10a which may be in accordance with the FIG. 1 schematic. Like numerals from the FIG. 2 embodiment have been used where appropriate, with some construction differences being indicated by the suffix "a". Memory cell 10a in FIG. 3 differs from that of FIG. 2 in that capacitor electrode 40a of capacitor 14a has an elevationally outermost surface 41 that is elevationally lower or deeper within substrate 16 than that of the FIG. 2 construction. Alternately, the one capacitor electrode may have its outermost surface higher (not shown) or shallower (not shown) within substrate 16 than that of the FIG. 2 construction. Regardless, the outermost surface need not be planar.

FIG. 2 shows an example embodiment where capacitor electrode 40 is directly against each of the pair of source/ drains 20, 22. FIG. 3 shows an example embodiment where capacitor electrode 40a is not directly against either of the pair of source/drains 20, 22.

FIG. 2 shows an example embodiment where channel 24 is not directly against capacitor dielectric 38. FIG. 3 shows an example embodiment where channel 24 is directly against capacitor dielectric 38 (e.g., channel 24 is at least in part electrically isolated from electrode 42 by capacitor dielectric 38).

Embodiments of the invention encompass structures wherein the capacitor dielectric is not necessarily directly received against one or both of source/drain regions 20, 22. Further, in some embodiments of the invention the capacitor dielectric extends into at least one of the source/drains, for example as shown with respect to a memory cell 10b in FIG. 4. Like numerals from the construction of FIG. 2 have been used where appropriate, with some construction differences being indicated with the suffix "b". The example FIG. 2 memory cell 10 does not have capacitor dielectric 38 of capacitor 14 extending to within either of source/drain regions 20, 22. In FIG. 4, capacitor dielectric 38b extends into at least one of source/drains 20, 22, and further to within both of source/drains 20, 22. Other attributes as described above may be used.

The above embodiments of FIGS. 2, 3 and 4 show examples wherein one capacitor electrode of the capacitor is electrically coupled to the channel (i.e., the one electrode includes additional construction other than the channel itself). FIG. 5 shows an example alternate embodiment memory cell 10c wherein one of the capacitor electrodes is the channel. Like numerals from the FIG. 2 embodiment have been used in FIG. 5, with some construction differences being indicated with the suffix "c". In FIG. 5, channel 24 and capacitor electrode 40c constitute the very same component, for example largely due to the construction and positioning of capacitor dielectric 38c. The other capacitor electrode 42c is at least that portion of body region 28 that is received immediately adjacent capacitor dielectric 38c. Other attributes as described above may be used.

FIG. 6 shows an additional alternate embodiment 10d to that of the embodiment of FIG. 5 wherein capacitor dielectric 38d extends into each of source/drain regions 20, 22. Like numerals from that of FIG. 5 have been used where appropriate, with some construction differences being indicated with the suffix "d". Other attributes as described above may be used.

Embodiments of the invention encompass methods of forming a memory cell comprising a transistor device and a capacitor. A first example method embodiment is described with reference to FIG. 7-9, for example to produce the construction of FIG. 3. Referring to FIG. 7, an opening 65 has been formed in a first semiconductor material 18 (e.g., by etching). Opening 65 has been lined with capacitor dielectric 38. A second semiconductor material 40 has been formed within opening 65 over capacitor dielectric 38 and over first semiconductor material 18 outside of opening 65. Such may also be formed over capacitor dielectric 38 outside of opening 65 as shown. Second semiconductor material 40 within opening 65 will comprise one of the capacitor electrodes of the memory cell capacitor. The first semiconductor material 18 under capacitor dielectric 38 will comprise another capacitor electrode of the memory cell capacitor. Second semiconductor material 40 may be formed by any suitable process, for example by chemical vapor deposition, by atomic layer deposition, and/or by epitaxial growth (e.g., using a seed layer if necessary).

Referring to FIG. 8, second semiconductor material 40 and capacitor dielectric 38 have been removed from being received outwardly of first semiconductor material 18, and second semiconductor material 40 has been recessed within opening 65.

Referring to FIG. 9, third semiconductor material 67 has been formed over second semiconductor material 40 to ultimately comprise a channel of the memory cell transistor. Third semiconductor material 67 may be of the same or different composition from that of one or both of first semiconductor material 18 and second semiconductor material 40. Such may be formed by any suitable process, for example by chemical vapor deposition, by atomic layer deposition, and/or by epitaxial growth (e.g., using a seed layer if necessary).

Referring to FIG. 10, gate construction 26 of the memory cell transistor has been at least partially formed operatively proximate what will be the channel region which comprises third semiconductor material 67. Source/drain regions (not shown in FIG. 10) of the memory cell transistor are formed with at least one of the first and second semiconductor materials, for example to produce the example embodiment construction of FIG. 3. The FIG. 3 construction, as one example, may be considered as showing source/drain regions 20, 22 formed within third semiconductive material 67 (not designated in FIG. 3) as well as into first semiconductor material 18 there-beneath as regions 20, 22 are shown in FIG. 3 as partially extending downwardly into semiconductor material 18 considered in the context of FIG. 10. Any other attribute as described above may alternately or additionally be used.

Another example method of forming a memory cell comprising a transistor device and a capacitor in accordance with an embodiment of the invention is next described with reference to FIGS. 11 and 12. Like numerals from the FIGS. 7-10 embodiment have been used where appropriate, with some construction differences being indicated with the suffix "e" or with different numerals. Referring to FIG. 11, opening 65 in first semiconductor material 18 has been lined with capacitor dielectric 38. Second semiconductor material 40e has been formed within opening 65 over capacitor dielectric 38 and over first semiconductor material 18 outside of opening 38. An example manner for forming second semiconductor material 40e is for such to comprise a monocrystalline material formed by epitaxial growth. An epitaxial-growth seed layer 70 may be provided within opening 65 over capacitor dielectric 38 to facilitate such growth. Second semiconductor material 40e within opening 65 will comprise one capacitor electrode of the memory cell capacitor and first semiconductor material 18 under capacitor dielectric 38 will comprise the other capacitor electrode of the memory cell capacitor.

Referring to FIG. 12, second semiconductor material 40e has been planarized back, and gate construction 26 has been formed there-over and accordingly operatively proximate a channel 24. Channel 24 and source/drains 20, 22 of the memory cell transistor have been formed with second semiconductor material 40e. Second material 40e as a channel and/or a capacitor electrode may or may not be homogenous in the final construction. Other attributes additionally or alternately as described above may be used. Further, memory cell 10e of FIG. 12 is another example embodiment memory cell independent of method implementation(s) of the invention.

Memory cells in accordance with the invention may comprise DRAM or other memory. Regardless, referring to FIG. 1, memory cell 10 may be operated in a binary manner. For example, memory cell 10 may have two stable states such as a stable state "1" where capacitor 14 retains a suitable charge and a stable state "0" where suitable charge is not retained by capacitor 14. The artisan will appreciate different operational regimes that may be used for reading, writing to, or erasing memory cell 10. By way of example only for a read operation, reference voltage line 50 may be provided at ground and data/sense line D/S placed at from about 200 millivolts to about 500 millivolts. Access line A could be turned "on" (e.g., provided at $V_{cc}$). Body region 28 may be provided at a suitable reference voltage (e.g., at ground). Then, a current would be sensed with sense amp SA associated with data/sense line D/S. If current is sensed, the memory cell is in state "1", whereas if current is not sensed the memory cell is in state "0". Such act of reading can be non-destructive (i.e., not requiring re-write after every read).

State "1" (capacitor 14 suitably charged) may be written to memory cell 10 in a number of manners as will be appreciated by the artisan. As an example, reference voltage line 50 may be provided at ground or very low voltage, and the access line A turned "off" (e.g., provided at ground). Data/sense line D/S may be provided at $V_{cc}$ or greater potential. This may result in gate induced drain leakage (GIDL) whereby suitable current leaks across transistor channel 24 to suitably charge capacitor 14, thereby providing memory cell 10 in state "1". An alternate method of writing state "1" to memory cell 10 as opposed to taking advantage of GIDL may use impact ionization. For example to write to state "1", access line A may be provided at $V_{cc}/2$, data/sense line D/S provided at $V_{cc}$, and reference voltage line 50 provided at ground. Such should cause sufficient current flow through transistor channel 24 to charge capacitor 14 and thereby provide memory cell 10 in state "1".

To erase memory cell 10 back to the state "0", either data/sense line D/S or reference voltage line 50 may be biased negatively while the other is provided at ground. This should inherently discharge transistor channel 24 and capacitor 14, thereby providing memory cell 10 in state "0".

One or more advantages may be achieved in embodiments of the invention. For example, the act of reading may be non-destructive, thereby minimizing or at least reducing refresh time. Further, no charge sharing may occur between storage capacitance and data/sense line capacitance (e.g., such parasitic capacitance may be reduced or eliminated). Further, the memory cell may ease restrictions on threshold voltage of the memory cell transistor, as the sub-threshold leakage may not affect cell retention time thus leading to very high read speed operation at least in comparison to floating body memory. Additionally, the storage capacitor may be built into the footprint of the access device (transistor) thus minimizing or reducing individual memory cell size. An example memory cell in accordance with the invention may have a retention time of at least 500 milliseconds with a storage capacitance as small as 2 femtofarads.

CONCLUSION

In some embodiments, a memory cell comprises a transistor device comprising a pair of source/drains, a body comprising a channel, and a gate construction operatively proximate the channel. The memory cell comprises a capacitor comprising a pair of capacitor electrodes having a capacitor dielectric there-between. One of the capacitor electrodes comprises the channel or is electrically coupled to the channel. The other of the capacitor electrode comprises a portion of the body other than the channel.

In some embodiments, a method of forming a memory cell comprising a transistor device and a capacitor includes lining an opening in first semiconductor material with capacitor dielectric. Second semiconductor material is formed within the opening over the capacitor dielectric and over the first semiconductor material outside of the opening. The second semiconductor material within the opening comprises one capacitor electrode of the memory cell capacitor. The first semiconductor material under the capacitor dielectric comprises another capacitor electrode of the memory cell capacitor. A channel and source/drains of the memory cell transistor are formed with the second semiconductor material. A gate construction of the memory cell transistor is formed operatively proximate the channel.

In some embodiments, a method of forming a memory cell comprising a transistor device and a capacitor includes lining an opening in first semiconductor material with capacitor dielectric. Second semiconductor material is formed within the opening over the capacitor dielectric. The second semiconductor material within the opening comprises one of the capacitor electrodes of the memory cell capacitor. The first semiconductor material under the capacitor dielectric comprises another capacitor electrode of the memory cell capacitor. Third semiconductor material is formed over the second semiconductor material to comprise a channel of the memory cell transistor. Source/drain regions of the memory cell transistor are formed with at least one of the first and third semiconductor materials. A gate construction of the memory cell transistor is formed operatively proximate the channel.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory cell comprising:
    a transistor device comprising a pair of source/drains, a body comprising a channel, and a gate construction operatively proximate the channel; and
    a capacitor comprising a pair of capacitor electrodes having a capacitor dielectric there-between, one of the capacitor electrodes comprising the channel or being electrically coupled to the channel, the other of the capacitor electrodes comprising a portion of the body other than the channel, the capacitor dielectric extending into both of the source/drains.

2. The memory cell of claim 1 wherein the capacitor dielectric extends only partially into and only partially elevationally through both of the source/drains from a lowest-most portion of each of the source/drains.

3. A memory cell comprising:
    a transistor device comprising a pair of source/drains, a body comprising a channel, and a gate construction operatively proximate the channel; and
    a capacitor comprising a pair of capacitor electrodes having a capacitor dielectric there-between, one of the capacitor electrodes comprising the channel or being electrically coupled to the channel other than through either of the source/drains, the other of the capacitor electrodes comprising a portion of the body other than the channel, the capacitor dielectric extending into at least one of the source/drains.

4. The memory cell of claim 3 wherein the channel is horizontally oriented, the gate construction being above the channel.

5. The memory cell of claim 3 wherein the other capacitor electrode comprises conductivity modifying dopant of the same type and of the same concentration as that of the channel.

6. The memory cell of claim 3 wherein the one capacitor electrode is the channel.

7. The memory cell of claim 3 wherein the one capacitor electrode is electrically coupled to the channel.

8. The memory cell of claim 7 wherein the one capacitor electrode comprises conductivity modifying dopant of the same type and of the same concentration as that of the channel.

9. The memory cell of claim 8 wherein the other capacitor electrode comprises conductivity modifying dopant of the same type and of the same concentration as that of the channel.

10. The memory cell of claim 7 wherein the one capacitor electrode comprises conductivity modifying dopant of the same type as that of the channel and of different concentration from that of the channel.

11. The memory cell of claim 10 wherein the conductivity modifying dopant of the one capacitor electrode is of higher concentration from that of the channel.

12. The memory cell of claim 7 wherein the channel and the one capacitor electrode are of the same composition.

13. The memory cell of claim 7 wherein the channel and the one capacitor electrode are of different compositions relative one another.

14. The memory cell of claim 13 wherein the channel is substantially monocrystalline and the one capacitor electrode is substantially polycrystalline.

15. The memory cell of claim 13 wherein each of the channel and the one capacitor electrode comprises doped silicon.

16. The memory cell of claim 7 wherein,
the channel is horizontally oriented;
the gate construction is above the channel; and
the one capacitor electrode is below the channel.

17. The memory cell of claim 7 wherein the capacitor dielectric is V-shaped in lateral cross-section.

18. The memory cell of claim 3 wherein the channel is directly against the capacitor dielectric.

19. The memory cell of claim 3 wherein the one capacitor electrode is directly against each of the pair of source/drains.

20. The memory cell of claim 3 wherein the one capacitor electrode is not directly against either of the pair of source/drains.

21. The memory cell of claim 3 wherein the memory cell comprises a data/sense line electrically coupled to one of the source/drains.

22. The memory cell of claim 3 wherein the memory cell comprises a reference voltage line other than a data/sense line electrically coupled to one of the source/drains.

23. The memory cell of claim 3 wherein the memory cell comprises a data/sense line electrically coupled to one of the source/drains and a reference voltage line other than the data/sense line electrically coupled to the other of the source/drains.

24. A memory cell comprising:
a transistor device comprising a pair of source/drains, a body comprising a channel, and a gate construction operatively proximate the channel; and
a capacitor comprising a pair of capacitor electrodes having a capacitor dielectric there-between, one of the capacitor electrodes comprising the channel or being electrically coupled to the channel, the other of the capacitor electrodes comprising a portion of the body other than the channel, the capacitor dielectric extending only partially into and only partially elevationally through at least one of the source/drains from a lowestmost portion of the at least one source/drain.

25. The memory cell of claim 24 wherein the one capacitor electrode is the channel.

26. The memory cell of claim 24 wherein the one capacitor electrode is electrically coupled to the channel.

* * * * *